United States Patent
Strader et al.

(10) Patent No.: US 10,741,471 B2
(45) Date of Patent: Aug. 11, 2020

(54) HIGHLY COMPLIANT NON-SILICONE PUTTIES AND THERMAL INTERFACE MATERIALS INCLUDING THE SAME

(71) Applicant: Laird Technologies, Inc., Chesterfield, MO (US)

(72) Inventors: Jason L. Strader, Cleveland, OH (US); Eugene Anthony Pruss, Avon Lake, OH (US)

(73) Assignee: LAIRD TECHNOLOGIES, INC., Chesterfield, MO (US)

( * ) Notice: Subject to any disclaimer, the term of this patent is extended or adjusted under 35 U.S.C. 154(b) by 2 days.

(21) Appl. No.: 16/250,214

(22) Filed: Jan. 17, 2019

(65) Prior Publication Data

US 2019/0229035 A1    Jul. 25, 2019

Related U.S. Application Data

(60) Provisional application No. 62/619,245, filed on Jan. 19, 2018.

(51) Int. Cl.

| | |
|---|---|
| *H01L 23/373* | (2006.01) |
| *C09K 5/14* | (2006.01) |
| *C08L 25/08* | (2006.01) |
| *C08J 9/228* | (2006.01) |
| *C08J 9/00* | (2006.01) |
| *H01L 23/552* | (2006.01) |

(52) U.S. Cl.
CPC ........ *H01L 23/3737* (2013.01); *C08J 9/0066* (2013.01); *C08J 9/228* (2013.01); *C08L 25/08* (2013.01); *C09K 5/14* (2013.01); *H01L 23/552* (2013.01); *C08J 2203/22* (2013.01); *C08J 2325/08* (2013.01); *C08L 2203/20* (2013.01); *C08L 2205/20* (2013.01)

(58) Field of Classification Search
CPC .................................................. C08L 2203/20
See application file for complete search history.

(56) References Cited

U.S. PATENT DOCUMENTS

| | | | |
|---|---|---|---|
| 3,615,972 | A | 10/1971 | Morehouse, Jr. et al. |
| 5,194,480 | A | 3/1993 | Block et al. |
| 5,738,936 | A | 4/1998 | Hanrahan |
| 5,929,138 | A | 7/1999 | Mercer et al. |
| 6,761,813 | B2 | 7/2004 | Xu |
| 6,900,163 | B2 | 5/2005 | Khatri |
| 6,926,955 | B2 | 8/2005 | Jayaraman et al. |
| 7,229,683 | B2 | 6/2007 | Fischer et al. |
| 7,252,877 | B2 | 8/2007 | Jayaraman et al. |
| 7,312,261 | B2 | 12/2007 | Sachdev et al. |
| 7,744,991 | B2 | 6/2010 | Fischer et al. |
| 7,816,785 | B2 | 10/2010 | Iruvanti et al. |
| 9,353,245 | B2 | 5/2016 | Tien et al. |
| 9,771,508 | B2 | 9/2017 | Bruzda et al. |
| 10,047,264 | B2 | 8/2018 | Lin |
| 10,087,351 | B2 | 10/2018 | Bruzda et al. |
| 2004/0241417 | A1* | 12/2004 | Fischer .................... B32B 7/06 428/317.9 |
| 2007/0089667 | A1 | 4/2007 | Hsiao |
| 2013/0237621 | A1* | 9/2013 | Kwak .................... C08J 9/0066 521/59 |
| 2017/0157702 | A1* | 6/2017 | Takada .................. B23K 26/38 |
| 2017/0322600 | A1 | 11/2017 | Nguyen et al. |
| 2018/0112115 | A1* | 4/2018 | Hamada ................. C08F 20/18 |

FOREIGN PATENT DOCUMENTS

JP         2002-128931    *    5/2002

OTHER PUBLICATIONS

Smooth-on hardness durometer scale from https://www.smooth-on.com/page/durometer-shore-hardness-scale/ (no date).*
Machine translation of JP 2002-128931 (no date).*
Expandable microsphere, https://en.wikipedia.org/wiki8/Expandable_Microsphere, Jul. 31, 2017, 2 pages.
Non-Silicon-Dispensable-Gap-Filler-Data-Sheet, <http://www.dupont.com/content/dam/dupont/products-and-services/electronic-and-electrical-materials/documents/temprion/K-29288-Temprion-GF0300-Non-Silicon-Dispensable-Gap-Filler-Data-Sheet.pdf>, 2017, 1 page.
Non-Silicone Thermal Putty TG-NSP25 t-Global Thermal Technology, <https://www.fulipoly.com/usa/assets/files/2017_data _sheets/SARCONNRc.pdf>, Mar. 4, 206, 4 pages.
TG-NSP25 Non-Silicone Thermal Putty, <http://www.tqlobalthermal.com/pdf/TG-NSP25.pdf> Jul. 1, 2017, 1 page.
The Bro-Therminterface-Sol, <https://assets.lairdtech.com/home/brandworld/files/THR-BRO-THERMINTERFACE%20092717.pdf> 2016, 8 pages.

* cited by examiner

*Primary Examiner* — Marc S Zimmer
(74) *Attorney, Agent, or Firm* — Harness, Dickey & Pierce, P.L.C.; Anthony G. Fussner

(57) ABSTRACT

Disclosed are exemplary embodiments of highly compliant non-silicone putties and thermal interface materials including the same. In an exemplary embodiment, a non-silicone putty includes at least one thermally-conductive filler and at least one other filler including hollow polymeric particles in a non-silicone polymer base or matrix. The non-silicone putty may have a thermal conductivity of at least about 3 Watts per meter-Kelvin and/or may have a hardness of less than about 30 Shore 00.

21 Claims, No Drawings

HIGHLY COMPLIANT NON-SILICONE PUTTIES AND THERMAL INTERFACE MATERIALS INCLUDING THE SAME

CROSS-REFERENCE TO RELATED APPLICATION

This application claims priority to and the benefit of U.S. Provisional Patent Application No. 62/619,245 filed Jan. 19, 2018. The entire disclosure of the above application is incorporated herein by reference.

FIELD

The present disclosure relates to highly compliant non-silicone putties and thermal interface materials including the same.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EM/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

Disclosed are exemplary embodiments of highly compliant non-silicone putties and thermal interface materials including the same. In an exemplary embodiment, a non-silicone putty includes at least one thermally-conductive filler and at least one other filler including hollow polymeric particles in a non-silicone polymer base or matrix. The non-silicone putty may have a thermal conductivity of at least about 3 Watts per meter-Kelvin and/or may have a hardness of less than about 30 Shore 00.

Further areas of applicability will become apparent from the description provided herein. The description and specific examples in this summary are intended for purposes of illustration only and are not intended to limit the scope of the present disclosure.

DETAILED DESCRIPTION

Example embodiments will now be described more fully with reference to the accompanying drawings.

As recognized herein, the need for thermal interface materials that are both highly compliant and possess high thermal conductivity continues to increase, driven by IC (integrated circuit) integration (e.g., system on chip (SoC), etc.) and increasing CPU (central processing unit) clock speeds. But obtaining high compliance and thermal conductivity in non-silicone thermal interface materials has been challenging. Despite the challenges, disclosed herein are exemplary embodiments of non-silicone thermal putties having relatively high thermal conductivity (e.g., greater than 3 W/mK, etc.) and/or relatively low hardness (e.g., less than 30 Shore 00 at 3 seconds, etc.). The non-silicone thermal putties may have low deflection pressures.

Disclosed herein are exemplary embodiments of highly compliant or conformable non-silicone putties having high thermal conductivities that may be used as thermal putty gap filler materials (broadly, thermal interface materials). In exemplary embodiments, the non-silicone putties include a non-silicone system (e.g., oil gel resin system, other non-silicone polymer system, etc.) and fillers (e.g., thermally-conductive metal and/or ceramic fillers, hollow polymeric particles, etc.). The non-silicone system may comprise an oil gel based on a combination of a styrene and ethylene/butylene copolymers and a styrene and ethylene/propylene copolymers. The fillers may comprise a combination of fillers including aluminum, metal oxide powders, and hollow polymeric particles (e.g., EXPANCEL microspheres, other hollow polymeric microspheres, expandable microspheres, etc.).

The non-silicone putty may include a total amount of filler such that the total filler weight percentage (wt %) is greater than about 90 wt % (e.g., 92.3 wt %, 93.5 wt %, within a range from about 90 wt % to about 94 wt %, etc.) of the total weight of the non-silicone putty. The non-silicone putty may include a total amount of hollow polymeric spheres such that the weight percentage of the hollow polymeric spheres is between about 0.3 wt % and about 0.6 wt % (e.g., 0.3 wt %, 0.33 wt %, 0.52 wt %, 0.6 wt %, etc.) of the total weight of the non-silicone putty and such that the volume percentage (vol %) of the hollow polymeric spheres is between about 20 vol % and about 31 vol % (e.g., 20.16 vol %, 22.06 vol %, 30.07 vol %, etc.) of the total volume of the non-silicone putty.

Aspects of the present disclosure will be further illustrated by the following examples. The following examples are merely illustrative, and do not limit this disclosure to the particular formulations in any way.

EXAMPLE 1

In this first example, a thermal interface material (specifically a non-silicone thermal putty gap filler) including one or more aspects of the present disclosure was generally formed from non-silicone oil gel resin and fillers.

The oil gel resin was based on a combination of a styrene and ethylene/butylene copolymers and a styrene and ethylene/propylene copolymers. The fillers included aluminum, metal oxide powders, and hollow polymeric particles (e.g., EXPANCEL microspheres, etc.) such that the total filler weight percentage was about 92.3 wt %, the weight percentage of the hollow polymeric spheres was about 0.3 wt %, and the volume percentage of the hollow polymeric spheres was about 20.16 vol %.

For this example formulation, the thermal interface material exhibited a thermal conductivity of about 3.9 W/mK. The thermal interface material exhibited a hardness of about 27.8 Shore 00 at 3 seconds and a hardness of about 6 Shore 00 at 30 seconds.

EXAMPLE 2

In this second example, a thermal interface material (specifically a non-silicone thermal putty gap filler) including one or more aspects of the present disclosure was generally formed from non-silicone oil gel resin and fillers.

The oil gel resin was based on a combination of a styrene and ethylene/butylene copolymers and a styrene and ethylene/propylene copolymers. The fillers included aluminum, metal oxide powders, and hollow polymeric particles (e.g., EXPANCEL microspheres, etc.) such that the total filler weight percentage was about 92.3 wt %, the weight percentage of the hollow polymeric spheres was about 0.52 wt %, and the volume percentage of the hollow polymeric spheres was about 30.07 vol %.

For this example formulation, the thermal interface material exhibited a thermal conductivity of about 3.6 W/mK. The thermal interface material exhibited a hardness of about 27.7 Shore 00 at 3 seconds.

EXAMPLE 3

In this third example, a thermal interface material (specifically a non-silicone thermal putty gap filler) including one or more aspects of the present disclosure was generally formed from non-silicone oil gel resin and fillers.

The oil gel resin was based on a combination of a styrene and ethylene/butylene copolymers and a styrene and ethylene/propylene copolymers. The fillers included aluminum, metal oxide powders, and hollow polymeric particles (e.g., EXPANCEL microspheres, etc.) such that the total filler weight percentage was about 93.5 wt %, the weight percentage of the hollow polymeric spheres was about 0.33 wt %, and the volume percentage of the hollow polymeric spheres was about 22.06 vol %. For this example formulation, the thermal interface material exhibited a thermal conductivity of about 5.1 W/mK.

In the examples above, each non-silicone thermal putty gap filler included hollow polymeric particles. The hollow polymeric particles may comprise EXPANCEL microspheres. Alternatively, other expandable and/or hollow polymeric particles (e.g., other hollow polymeric microspheres, other expandable microspheres, etc.) may be used in other exemplary embodiments.

In exemplary embodiments, the non-silicone thermal putty gap filler may include expandable microspheres that are microscopic spheres having a thermoplastic shell encapsulating a low boiling point liquid hydrocarbon. When heated to a temperature high enough to soften the thermoplastic shell, the increasing pressure of the liquid hydrocarbon within the thermoplastic shell will cause the microsphere to expand and increase in volume (e.g., up to 60 to 80 times, etc.). The microspheres may thus have the ability to expand, may be resilient, and may be low density when expanded.

In exemplary embodiments, the non-silicone thermal putty gap filler may be used to fill a gap between two opposing heat transfer surfaces within an electronic device. For example, the non-silicone thermal putty gap filler may be positioned generally between a heat source and a heat removal/dissipation structure or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat removal/dissipation structure or component. During operation of the electronic device, the thermal interface material may then function to allow transfer (e.g., to conduct heat, etc.) of heat from the heat source along the thermally-conductive path to the heat removal/dissipation structure or component. Also during operation of the electronic device, the thermoplastic shells of the expandable microspheres of the non-silicone thermal putty gap filler may be heated by heat from the heat source to a temperature high enough to soften the thermoplastic shells, such that increasing pressure of the liquid hydrocarbon within the thermoplastic shells will cause the microspheres to expand and increase in volume. In some exemplary embodiments in which the non-silicone thermal putty gap filler also includes EMI or microwave absorbers, the non-silicone thermal putty gap filler may also be operable for absorbing a portion of the EMI incident upon the non-silicone thermal putty gap filler.

In some exemplary embodiments, the non-silicone putties may be entirely free of silicone. In other exemplary embodiments, the non-silicone putties may be substantially free of silicone, such that there may be a de minimis or trivial amount of silicone in a non-silicone putty. For example, the amount of silicone may be low enough to be undetectable and/or low enough so as to not adversely affect the end use applications of the non-silicone putty, which might otherwise be adversely affected by the presence of a more than trivial amount of silicone.

The amount and types of fillers may vary in different embodiments of the non-silicone putties and thermal interface materials. By way of example, some exemplary embodiments of the non-silicone putties include a total filler loadings greater than 90 weight percent of the total weight of the non-silicone putty, a weight percentage of the hollow polymeric particles about equal to or greater than about 0.3 wt % of the total weight of the non-silicone putty, and a volume percentage of the hollow polymeric spheres greater than about 20 vol % of the total volume of the non-silicone putty. Alternative embodiments may include a non-silicone putty having higher or lower amounts of fillers, including less than 90 wt % of total filler loading, less than 0.3 wt % of hollow polymeric particles, and/or less than 20 vol % of the hollow polymeric particles.

Also, a wide range of different individual or combinations of thermally-conductive fillers may be used with the hollow polymeric particles in exemplary embodiments of the non-silicone putties and thermal interface materials according to the present disclosure. In the examples disclosed herein, the non-silicone putties included aluminum, metal oxide powders, and hollow polymeric particles (e.g., EXPANCEL microspheres, etc.). Other exemplary embodiments may include one or more other thermally-conductive fillers, such as zinc oxide, boron nitride, alumina, silicon nitride, aluminum nitride, iron, metallic oxides, graphite, silver, copper, ceramics, combinations thereof (e.g., alumina and zinc oxide, etc.). In addition, exemplary embodiments may also include different grades (e.g., different sizes, different purities, different shapes, etc.) of the same (or different) thermally conductive fillers. For example, an exemplary embodiment of a non-silicone putty or thermal interface material may include two different sizes of boron nitride. Or, for example, an exemplary embodiment of a non-silicone putty or thermal interface material may include multiple grades of aluminum and/or multiple grades of alumina where the grades have different mean particle sizes and different particle size ranges. By varying the types and grades of thermally-conductive fillers, the final characteristics of the non-silicone putty or thermal interface material (e.g., thermal conductivity, cost, hardness, etc.) may be varied as desired.

Other suitable fillers and/or additives may also be added to a non-silicone putter or thermal interface material to achieve various desired outcomes (e.g., a thixotropic and/or dispensable putty, etc.). Examples of other fillers that may be added include pigments, plasticizers, process aids, flame retardants, extenders, electromagnetic interface (EMI) or microwave absorbers, electrically-conductive fillers, magnetic particles, etc.

In some exemplary embodiments, the non-silicone putties may be configured for use as a thermal management and/or EMI mitigation material, such as a thermally-conductive microwave/RF/EMI absorber that includes silicon carbide. For example, a non-silicone putty may include silicon carbide, carbonyl iron powder, and alumina. In some exemplary embodiments, the non-silicone putty may further include manganese zinc (MnZn) ferrite and magnetic flakes. The resulting thermally-conductive EMI absorber may have a high thermal conductivity (e.g., at least 3 Watts per meter per Kelvin (W/m-K) or higher, etc.) and high EMI absorption or attenuation (e.g., at least 9 decibels per centimeter (dB/cm) at a frequency of at least 1 GHz, at least 17 dB/cm at a frequency of at least 15 GHz, etc.). In other exemplary embodiments, a non-silicone putty may comprise a thermally-conductive EMI absorber that includes one or more other ceramics, and/or other EMI absorbing materials.

The non-silicone putties disclosed herein may have a relatively high thermal conductivity, such as a thermal conductivity of at least about 3 watts per meter per Kelvin (W/mK) (e.g., 3 W/mK, 3.1 W/mK, 3.2 W/mK, 3.6 W/mK, 3.9 W/mK, 5.1 W/mK, between 3 W/mK and 6 W/mK, etc.) depending on the particular materials used to make the material and loading percentages of the thermally-conductive filler. These thermal conductivities are only examples as other embodiments may include a non-silicone putty with a thermal conductivity less than 3 W/mK or greater than 5.1 W/mK, etc.

A non-silicone putty disclosed herein may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the non-silicone putty to closely conform (e.g., in a relatively close fitting and encapsulating manner, etc.) to a mating surface when placed in contact with the mating surface, including a non-flat, curved, or uneven mating surface. For example, a non-silicone putty disclosed herein may have very high compliancy such that the non-silicone putty will relatively closely conform to the size and outer shape of a heat source when the non-silicone putty is along an inner surface of a cover of an EMI shield (e.g., a one-piece or two board level shield, etc.) and the non-silicone putty is compressed against the heat source when the EMI shield is installed to a printed circuit board over the heat source.

In exemplary embodiments, a non-silicone putty disclosed herein may be used to define or provide part of a thermally-conductive heat path from a heat source to a heat removal/dissipation structure or component. The non-silicone putty may be used, for example, to help conduct thermal energy (e.g., heat, etc.) away from a heat source of an electronic device (e.g., one or more heat generating components, central processing unit (CPU), die, semiconductor device, etc.). The non-silicone putty may be positioned generally between a heat source and a heat removal/dissipation structure or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat removal/dissipation structure or component. The non-silicone putty may then function to allow transfer (e.g., to conduct heat, etc.) of heat from the heat source along the thermally-conductive path to the heat removal/dissipation structure or component. In some exemplary embodiments in which the non-silicone putty is also an EMI absorber, the non-silicone putty may also be operable for absorbing a portion of the EMI incident upon the non-silicone putty.

Example embodiments of the non-silicone putties disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, system on chip (SoC), etc.). Generally, a heat source may comprise any component or device that has a higher temperature than the non-silicone putty or otherwise provides or transfers heat to the non-silicone putty regardless of whether the heat is generated by the heat source or merely transferred through or via the heat source. Accordingly, aspects of the present disclosure should not be limited to use with any single type of heat source, electronic device, heat removal/dissipation structure, etc.

Exemplary methods of making non-silicone putties suitable for use as thermal interface material are disclosed. In this exemplary embodiment, a method may include adding at least one thermally-conductive filler and at least one other filler including hollow polymeric particles to a non-silicone polymer base or matrix, such that the non-silicone putty has a thermal conductivity of at least about 3 Watts per meter-Kelvin and/or a hardness of less than about 30 Shore 00.

Exemplary methods relating to heat dissipation from one or more heat sources are also disclosed. In an exemplary embodiment, a method may include positioning a non-silicone putty relative to one or more heat sources, such that a thermally-conductive heat path is defined from the one or more heat sources to the non-silicone putty. The non-silicone putty may include at least one thermally-conductive filler and at least one other filler including hollow polymeric particles in a non-silicone polymer base or matrix, such that the non-silicone putty has a thermal conductivity of at least about 3 Watts per meter-Kelvin and/or a hardness of less than about 30 Shore 00.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal interface material comprising at least one thermally-conductive filler and at least one other filler including hollow polymeric particles in a non-silicone polymer base or matrix, wherein the thermal interface material has a thermal conductivity of at least about 3 Watts per meter-Kelvin and/or a hardness of less than about 30 Shore 00 at three seconds.

2. The thermal interface material of claim 1, wherein the hollow polymeric particles of the at least one other filler comprise hollow polymeric spheres.

3. The thermal interface material of claim 1, wherein the hollow polymeric particles of the at least one other filler comprise expandable microspheres.

4. The thermal interface material of claim 1, wherein the hollow polymeric particles of the at least one other filler comprise a thermoplastic shell encapsulating a low boiling point liquid hydrocarbon.

5. The thermal interface material of claim 1, wherein the non-silicone polymer base or matrix comprises a non-silicone oil gel resin.

6. The thermal interface material of claim 1, wherein the non-silicone polymer base or matrix comprises:
   a styrene and ethylene/butylene copolymers; and/or
   a styrene and ethylene/propylene copolymers.

7. The thermal interface material of claim 1, wherein the at least one thermally-conductive filler comprises aluminum and/or metal oxide powder.

8. The thermal interface material of claim 1, wherein the thermal interface material includes:
   at least about 90 percent by weight of the at least one thermally-conductive filler and the at least one other filler; and
   at least about 0.3 percent by weight of the at least one other filler.

9. The thermal interface material of claim 1, wherein the thermal interface material includes about 92 percent by weight of the at least one thermally-conductive filler and the at least one other filler, and about 0.3 percent by weight of the at least one other filler.

10. The thermal interface material of claim 9, wherein the thermal interface material has a thermal conductivity of at least about 3.9 Watts per meter-Kelvin and a hardness of less than about 28 Shore 00 at three seconds.

11. The thermal interface material of claim 1, wherein the thermal interface material includes about 92 percent by weight of the at least one thermally-conductive filler and the at least one other filler, and about 0.5 percent by weight of the at least one other filler.

12. The thermal interface material of claim 11, wherein the thermal interface material has a thermal conductivity of at least about 3.6 Watts per meter-Kelvin and a hardness of less than about 28 Shore 00 at three seconds.

13. The thermal interface material claim 1, wherein the thermal interface material includes about 93.5 percent by weight of the at least one thermally-conductive filler and the at least one other filler, and about 0.3 percent by weight of the at least one other filler.

14. The thermal interface material of claim 13, wherein the thermal interface material has a thermal conductivity of at least about 5 Watts per meter-Kelvin.

15. The thermal interface material of claim 1, wherein the thermal interface material is a non-silicone putty that does not include silicone.

16. A non-silicone putty comprising at least one thermally-conductive filler and at least one other filler including hollow polymeric particles in a non-silicone polymer base or matrix, wherein the non-silicone putty has a thermal conductivity of at least about 3 Watts per meter-Kelvin and/or a hardness of less than about 30 Shore 00 at three seconds.

17. The non-silicone putty of claim 16, wherein:
   the hollow polymeric particles of the at least one other filler comprise hollow polymeric spheres and/or expandable microspheres; and
   the non-silicone polymer base or matrix comprises a non-silicone oil gel resin including a styrene and ethylene/butylene copolymers and/or a styrene and ethylene/propylene copolymers.

18. The non-silicone putty of claim 16, wherein:
   the non-silicone putty includes at least about 90 percent by weight of the at least one thermally-conductive filler and the at least one other filler; and at least about 0.3 percent by weight of the at least one other filler.

19. The non-silicone putty of claim 16, wherein the non-silicone putty includes:
   about 92 percent by weight of the at least one thermally-conductive filler and the at least one other filler, and about 0.3 percent by weight of the at least one other filler, and the non-silicone putty has a thermal conductivity of at least about 3.9 Watts per meter-Kelvin and a hardness of less than about 28 Shore 00 at three seconds; or
   about 92 percent by weight of the at least one thermally-conductive filler and the at least one other filler, and about 0.5 percent by weight of the at least one other filler, and the non-silicone putty has a thermal conductivity of at least about 3.6 Watts per meter-Kelvin and a hardness of less than about 28 Shore 00 at three seconds; or
   about 93.5 percent by weight of the at least one thermally-conductive filler and the at least one other filler, and about 0.3 percent by weight of the at least one other filler, and the non-silicone putty has a thermal conductivity of at least about 5 Watts per meter-Kelvin.

20. A method comprising using a thermal interface material within a gap between two opposing heat transfer surfaces within an electronic device, the thermal interface material including at least one thermally-conductive filler and at least one other filler including hollow polymeric particles in a non-silicone polymer base or matrix, wherein the thermal interface material has a thermal conductivity of at least about 3 Watts per meter-Kelvin and/or a hardness of less than about 30 Shore 00 at three seconds.

21. The method of claim 20, wherein the hollow polymeric particles of the at least one other filler comprise expandable microspheres having thermoplastic shells and liquid hydrocarbon within the thermoplastic shells, whereby during operation of the electronic device, the thermoplastic shells of the expandable microspheres are heated by heat from a heat source of the electronic device to a temperature high enough to soften the thermoplastic shells, such that increasing pressure of the liquid hydrocarbon within the thermoplastic shells causes the expandable microspheres to expand and increase in volume.

* * * * *